(12) United States Patent
Katagiri

(10) Patent No.: US 10,583,494 B2
(45) Date of Patent: Mar. 10, 2020

(54) COATED DRILL

(71) Applicant: TUNGALOY CORPORATION, Fukushima (JP)

(72) Inventor: Takao Katagiri, Iwaki (JP)

(73) Assignee: TUNGALOY CORPORATION, Iwaki-shi, Fukushima (JP)

( * ) Notice: Subject to any disclaimer, the term of this patent is extended or adjusted under 35 U.S.C. 154(b) by 0 days.

(21) Appl. No.: 16/131,129

(22) Filed: Sep. 14, 2018

(65) Prior Publication Data
US 2019/0084052 A1    Mar. 21, 2019

(30) Foreign Application Priority Data

Sep. 19, 2017  (JP) .................................. 2017-179177

(51) Int. Cl.
*B32B 9/00* (2006.01)
*B23B 27/14* (2006.01)
(Continued)

(52) U.S. Cl.
CPC .......... *B23B 27/148* (2013.01); *C23C 14/024* (2013.01); *C23C 14/0617* (2013.01);
(Continued)

(58) Field of Classification Search
None
See application file for complete search history.

(56) References Cited

U.S. PATENT DOCUMENTS 5,272,014 A * 12/1993 Leyendecker .......... C23C 14/06
427/569
2012/0090247 A1* 4/2012 Miura ................. C23C 14/0036
51/309
(Continued)

FOREIGN PATENT DOCUMENTS

EP        1698714 A2 *  9/2006 ......... C23C 14/0641
JP      2008-188689 A     8/2008
(Continued)

OTHER PUBLICATIONS

Phinichka et al., Ionized magnetron sputter deposition of hard nanocomposite TiN/amorphous-silicon nitride films, 2004, Journal of Vacuum Science and Technology, vol. 22, issue 3, p. 477-481. (Year: 2004).*

*Primary Examiner* — Seth Dumbris
*Assistant Examiner* — Kim S. Horger
(74) *Attorney, Agent, or Firm* — Studebaker & Brackett PC

(57) ABSTRACT

A coated drill includes a substrate; a coating layer formed on the substrate, and a chisel edge portion and a margin portion. An alternating laminate structure of a first composite nitride layer including a compound having a composition represented by the formula $(Al_{1-x}Cr_x)N$, where x satisfies $0.10 \leq x \leq 0.60$ and a second composite nitride layer including a compound having a composition represented by the formula $(Ti_{1-y}Si_y)N$, where y satisfies $0.05 \leq y \leq 0.30$ are in the chisel edge portion and the margin portion. An atomic ratio of the Cr element based on the total of the Al element and the Cr element in the first composite nitride layer is greater in the chisel edge portion than in the margin portion.

20 Claims, 4 Drawing Sheets

(51) Int. Cl.
    *C23C 14/06*     (2006.01)
    *C23C 14/32*     (2006.01)
    *C23C 16/32*     (2006.01)
    *C23C 28/00*     (2006.01)
    *C23C 30/00*     (2006.01)
    *C23C 14/02*     (2006.01)
    *C23C 28/04*     (2006.01)

(52) U.S. Cl.
    CPC ........ *C23C 14/0641* (2013.01); *C23C 14/325* (2013.01); *C23C 16/325* (2013.01); *C23C 28/00* (2013.01); *C23C 28/044* (2013.01); *C23C 28/42* (2013.01); *C23C 30/005* (2013.01)

(56) References Cited

U.S. PATENT DOCUMENTS

2013/0108850 A1* 5/2013 Kudo ................ C04B 35/5831
                                                    428/216
2015/0232978 A1   8/2015 Schier

FOREIGN PATENT DOCUMENTS

JP          2013046956 A   *  3/2013
JP          2015-530270 A     10/2015

\* cited by examiner

COATED DRILL

TECHNICAL FIELD

The present invention relates to a coated drill.

BACKGROUND ART

For the cutting of steel, cast iron, stainless steel, heat-resistant alloys, etc., a surface coated cutting tool has been widely employed which comprises, on a surface of a substrate consisting of cemented carbide, cermet, cBN or the like, one layer or two or more layers each comprised of a hard coating, such as a TiN film or a TiAlN film.

For example, Japanese Translation of PCT Application No. 2015-530270 proposes a tool in which TiSiN layers and AlCrN layers are alternately laminated on a main body made of cemented carbide, cermet, ceramic, steel, or high-speed steel so that each layer has a thickness of 0.5 nm to 15 nm.

SUMMARY

Technical Problem

The speed of cutting has recently gained in importance in the field of machining, and there is a demand for further improvement in wear resistance and chipping resistance of coated drills. In particular, under cutting conditions at which machining is performed at high speed, the coating layer of a chisel edge portion is worn at an early stage. Due to this wear, chipping tends to occur in the chisel edge portion. This triggers the problem that the tool life cannot be extended. In order to cope with such a problem, it is required to further improve the wear resistance and chipping resistance of coated cutting tools (especially, coated drills) such as disclosed in Japanese Translation of PCT Application No. 2015-530270.

The present invention has been accomplished to solve this problem, and it is an object of the present invention to provide a coated drill having excellent wear resistance and chipping resistance which make it possible to extend the tool life.

Solution to Problem

The inventor of the present invention has conducted extensive research on extension of the tool life of coated drills and have found that wear resistance and chipping resistance can be improved thereby making it possible to extend the tool life of a coated drill when the layer structure and composition of the coating layer are improved and the specific atomic ratio of the coating layer formed at the chisel edge portion and the specific atomic ratio of the coating layer formed on the margin portion satisfy a predetermined relationship. This finding led to the completion of the present invention.

That is, the present invention can be summarized as follows.

[1] A coated drill comprising: a substrate; and a coating layer formed on the substrate, wherein the coated drill has a chisel edge portion and a margin portion;

the coating layer in the chisel edge portion and the margin portion has an alternating laminate structure of an alternating laminate of:

a first composite nitride layer including a compound having a composition represented by formula (1) below:

$$(Al_{1-x}Cr_x)N \quad (1)$$

(in the formula, x denotes an atomic ratio of the Cr element based on the total of the Al element and the Cr element and satisfies $0.10 \leq x \leq 0.60$); and a second composite nitride layer including a compound having a composition represented by formula (2) below:

$$(Ti_{1-y}Si_y)N \quad (2)$$

(in the formula, y denotes an atomic ratio of the Si element based on the total of the Ti element and the Si element and satisfies $0.05 \leq y \leq 0.30$);

an atomic ratio $C_{Cr}$ of the Cr element based on the total of the Al element and the Cr element in the first composite nitride layer in the chisel edge portion and an atomic ratio $M_{Cr}$ of the Cr element based on the total of the Al element and the Cr element in the first composite nitride layer in the margin portion satisfy a condition represented by formula (A) below:

$$C_{Cr} > M_{Cr} \quad (A).$$

[2] The coated drill according to [1], wherein a difference between the $C_{Cr}$ and the $M_{Cr}$ satisfies a condition represented by formula (B) below:

$$0.01 \leq C_{Cr} - M_{Cr} \leq 0.10 \quad (B).$$

[3] The coated drill according to [1] or [2], wherein an average thickness of each of the layers of the first composite nitride layer is 70 nm or more and 300 nm or less, and an average thickness of each of the layers of the second composite nitride layer is 70 nm or more and 300 nm or less.

[4] The coated drill according to any one of [1] to [3], wherein in the second composite nitride layer, a full width at half maximum (FWHM) for a (200) plane in X-ray diffraction is 0.4° or more and 1.0° or less.

[5] The coated drill according to any one of [1] to [4], wherein an average thickness of the alternating laminate structure is 1.5 μm or more and 12.0 μm or less.

[6] The coated drill according to any one of [1] to [5], wherein the coating layer has a lower layer between the substrate and the alternating laminate structure;

the lower layer is comprised of a single layer or a laminate of a compound of: an element of at least one kind selected from the group consisting of Ti, Zr, Hf, V, Nb, Ta, Cr, Mo, W, Al, Si, and Y and an element of at least one kind selected from the group consisting of C, N, O, and B; and an average thickness of the lower layer is 0.1 μm or more and 3.5 μm or less.

[7] The coated drill according to any one of [1] to [6], wherein the coating layer has an upper layer on a surface of the alternating laminate structure;

the upper layer is comprised of a single layer or a laminate of a compound of: an element of at least one kind selected from the group consisting of Ti, Zr, Hf, V, Nb, Ta, Cr, Mo, W, Al, Si, and Y and an element of at least one kind selected from the group consisting of C, N, O, and B; and an average thickness of the upper layer is 0.1 μm or more and 3.5 μm or less.

[8] The coated drill according to any one of [1] to [7], wherein an average thickness of the coating layer in its entirety is 1.5 μm or more and 15.0 μm or less.

[9] The coated drill according to any one of [1] to [8], wherein the substrate is any one of a cemented carbide, a cermet, a ceramic, and a cubic boron nitride sintered body.

Advantageous Effects of Invention

The coated drill of the present invention has excellent wear resistance and chipping resistance which make it possible to extend the tool life.

DESCRIPTION OF EMBODIMENTS

Figure 1:
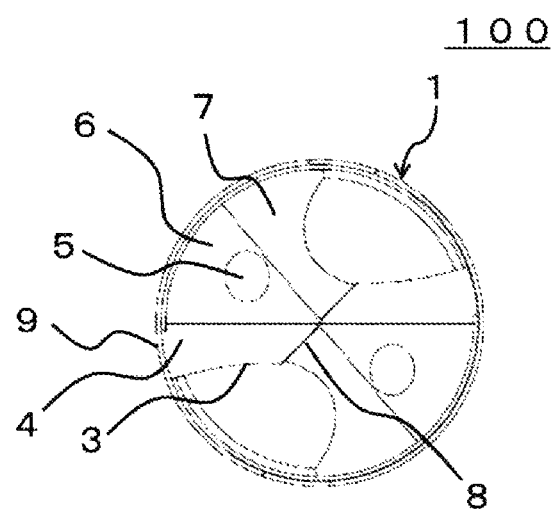
FIG. 1 is a front view of a general solid drill.

Hereinafter, an embodiment for carrying out the present invention (hereinafter simply referred to as the "present embodiment") will be described in detail, but the present invention is not limited to the present embodiment hereinbelow. The present invention can be variously modified without departing from the gist thereof.

A coated drill of the present embodiment includes: a substrate; and a coating layer formed on the substrate, wherein the coated drill has a chisel edge portion and a margin portion;
the coating layer in the chisel edge portion and the margin portion has an alternating laminate structure of an alternating laminate of:
a first composite nitride layer including a compound having a composition represented by formula (1) below:

$(Al_{1-x}Cr_x)N$      (1)

(in the formula, x denotes the atomic ratio of the Cr element based on the total of the Al element and the Cr element and satisfies $0.10 \leq x \leq 0.60$); and
a second composite nitride layer including a compound having a composition represented by formula (2) below:

$(Ti_{1-y}Si_y)N$      (2)

(in the formula, y denotes the atomic ratio of the Si element based on the total of the Ti element and the Si element and satisfies $0.05 \leq y \leq 0.30$);
an atomic ratio $C_{Cr}$ of the Cr element based on the total of the Al element and the Cr element in the first composite nitride layer in the chisel edge portion and an atomic ratio $M_{Cr}$ of the Cr element based on the total of the Al element and the Cr element in the first composite nitride layer in the margin portion satisfy a condition represented by formula (A) below:

$C_{Cr} > M_{Cr}$      (A).

Since the coated drill of the present embodiment has the above-described configuration, wear resistance and chipping resistance can be improved. As a result, the tool life of the coated drill can be extended. Factors of the improvement of wear resistance of the coated drill of the present embodiment are considered hereinbelow. However, the present invention is not limited at all by these factors. Thus, first, in the coated drill of the present embodiment, wear resistance is improved because the formation of hexagonal Al nitride having poor wear resistance can be suppressed as a result of the atomic ratio x of the Cr element in the formula (1) being 0.10 or more, and because the formation of Cr nitride having poor wear resistance can be suppressed as a result of the atomic ratio x of the Cr element being 0.60 or less. Further, in the coated drill of the present embodiment, wear resistance is improved because the hardness is improved as a result of the atomic ratio y of the Si element in the formula (2) being 0.05 or more, and because the formation of an amorphous phase having poor wear resistance can be suppressed as a result of the atomic ratio y of the Si element being 0.30 or less. Furthermore, in the coated drill of the present embodiment, friction wear coefficient of the chisel edge portion is lowered which, in particular, improves the wear resistance of the chisel edge portion, because the condition represented by the formula (A) is satisfied. In addition, the hardness at high temperature of the margin part is improved which, in particular, improves the wear resistance of the margin portion. It is conceivable that as a result of combining the abovementioned features, the coated drill of the present embodiment has greatly improved wear resistance, in particular, greatly improved wear resistance of the chisel edge portion and the margin portion. Meanwhile, factors of the improvement of chipping resistance of the coated drill of the present embodiment are considered hereinbelow. However, the present invention is not limited at all by these factors. Thus, first, in the coated drill of the present embodiment, the structure is refined, which makes it possible to suppress the decrease in residual stresses in the first composite nitride layer and ensures excellent adhesiveness, because the atomic ratio x of the Cr element in the formula (1) is 0.60 or less. As a result, excellent chipping resistance is obtained. Further, in the coated drill of the present embodiment, the formation of an amorphous phase is suppressed and uniform microstructure is obtained, which makes it possible to suppress the decrease in residual stresses in the first composite nitride layer and ensures excellent adhesiveness, because the atomic ratio y of the Si element is 0.30 or less in the formula (2). As a result, excellent chipping resistance is obtained. It is also conceivable that as a result of combining the abovementioned features, the coated drill of the present embodiment has greatly improved chipping resistance, in particular, greatly improved chipping resistance of the chisel edge portion and the margin portion.

In the coated drill of the present embodiment, the coating layer may be formed at least on the chisel edge portion and the margin portion, but a coating layer may be also formed on other portions (for example, a part or the whole of the cutting edge ridgeline portion).

The substrate used in the present embodiment may have, for example, a drill-like form including a chisel edge portion and a margin portion. In the present specification, the term "drill-like form" means a form that has at least a portion (cutting portion) that is in contact with a workpiece and cuts the workpiece in a general drill (for example, a solid drill and a head exchangeable drill) and may be the form of only the cutting portion. Here, in the head exchangeable drill, a drill head which can be detachably held in the drill holder (holding portion) corresponds to the cutting portion.

Figure 2:
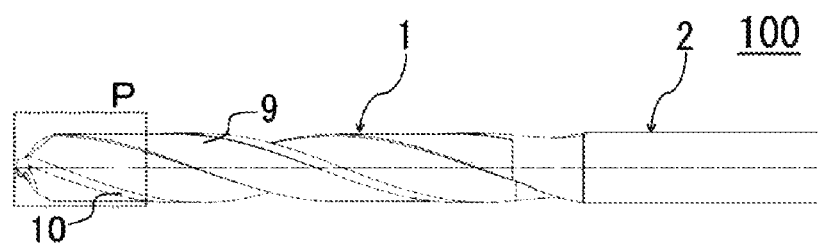
FIG. 2 is a partial side view of the solid drill shown in FIG. 1.
Figure 3:
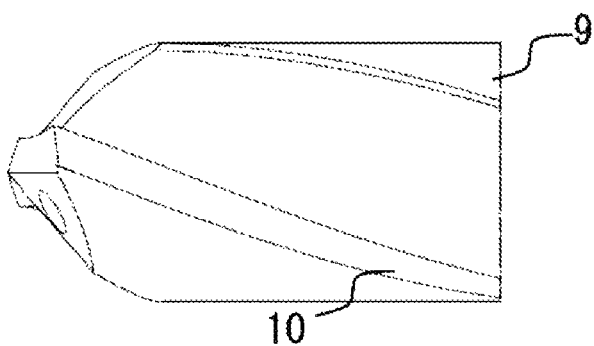
FIG. 3 is an enlarged view of a portion surrounded by a dotted line P in the partial side view shown in FIG. 2.

FIGS. 1 to 3 show a general solid drill (drill). A drill 100 has a cutting portion 1 for cutting a workpiece and a holding portion 2 for holding the cutting portion 1. A pair of tip cutting edge ridges 3, a first flank 4, a second flank 6, an oil hole 5 opened at the second flank 6, and a chisel edge portion 8 defined by a cross thinning 7 are formed at the distal end portion of the cutting edge of the cutting portion 1. As shown in FIGS. 2 and 3, a pair of twist grooves 9 is formed in the outer peripheral direction of the cutting portion 1, and a margin portion 10 is formed on the outer periphery of the tip cutting edge ridges 3.

The substrate can be exemplified by a cemented carbide, a cermet, a ceramic, a cubic boron nitride sintered body, a diamond sintered body, and high-speed steel. Among them, it is more preferable that the substrate be one or more selected from the group consisting of a cemented carbide, a cermet, a ceramic and a cubic boron nitride sintered body, because the chipping resistance is further improved.

In the coated drill of the present embodiment, when the average thickness of the entire coating layer is 1.5 μm or more, the wear resistance tends to further improve. Meanwhile, in the coated drill of the present embodiment, when the average thickness of the entire coating layer is 15.0 μm or less, the chipping resistance tends to further improve. Therefore, the average thickness of the entire coating layer is preferably 1.5 μm or more and 15.0 μm or less. Within this range, from the same viewpoints as above, the average thickness of the entire coating layer is more preferably 2.0 μm or more and 10.0 μm or less, and even more preferably 3.0 μm or more and 9.0 μm or less.

The coating layer used in the present embodiment has an alternating laminate structure in which two or three or more layers having different compositions are alternately laminated. At least one layer in the alternating laminate structure includes a specific layer (hereinafter referred to as a "first composite nitride layer") described below. The first composite nitride layer in the present embodiment has a composition represented by formula (1) below:

$$(Al_{1-x}Cr_x)N \qquad (1).$$

In the first composite nitride layer used in the present embodiment, it is preferable that the compound having the composition represented by the formula (1) include cubic crystals or cubic crystals and hexagonal crystals. In the above formula (1), x denotes the atomic ratio of the Cr element based on the total of the Al element and the Cr element and satisfies $0.10 \leq x \leq 0.60$. As described above, the coated drill of the present embodiment is excellent in wear resistance because the atomic ratio x of the Cr element is 0.10 or more, and excellent in wear resistance and chipping resistance because the atomic ratio x of the Cr element is 0.60 or less. Within this range, it is preferable that x be 0.15 or more and 0.50 or less because excellent balance between wear resistance and chipping resistance is obtained.

At least one layer in the alternating laminate structure includes a specific layer (hereinafter referred to as a "second composite nitride layer") described below. The second composite nitride layer used in the present embodiment has a composition represented by formula (2) below:

$$(Ti_{1-y}Si_y)N \qquad (2).$$

In the second composite nitride layer used in the present embodiment, it is preferable that the compound having the composition represented by the formula (2) include cubic crystals. y denotes the atomic ratio of the Si element based on the total of the Ti element and the Si element and satisfies $0.05 \leq y \leq 0.30$. As described above, the coated drill of the present embodiment is excellent in wear resistance because the atomic ratio y of the Si element is 0.05 or more, and excellent in wear resistance and chipping resistance because the atomic ratio y of the Si element is 0.30 or less. Within this range, it is preferable that y be 0.10 or more and 0.25 or less because excellent balance between wear resistance and adhesiveness is obtained.

In the present embodiment, when the composition of each composite nitride layer is expressed as $(Al_{0.70}Cr_{0.30})N$, it means that the atomic ratio of the Al element based on the total of the Al element and the Cr element is 0.70, and the atomic ratio of the Cr element based on the total of the Al element and the Cr element is 0.30. That is, the amount of the Al element based on the total of the Al element and the Cr element is 70 atomic %, and the amount of the Cr element based on the total of the Al element and the Cr element is 30 atomic %.

In the coated drill of the present embodiment, because the first composite nitride layer includes a compound having the composition represented by the above formula (1), particularly excellent wear resistance of the chisel edge portion is obtained. It is conceivable that the main factor is a decrease in friction wear coefficient, but the present invention is not limited at all by this factor. Meanwhile, in the coated drill of the present embodiment, because the second composite nitride layer includes a compound having the composition represented by the formula (2), particularly excellent wear resistance of the margin portion is obtained. It is conceivable that the main factor is an increase in hardness at high temperature, but the present invention is not limited at all by this factor. Therefore, where the coated drill of the present embodiment has the alternating laminate structure of the first composite nitride layer and the second composite nitride layer, the balance between the wear resistance and the chipping resistance of the chisel edge portion and the margin portion is particularly improved.

In the coated drill of the present embodiment, the atomic ratio $C_{Cr}$ of the Cr element based on the total of the Al element and the Cr element in the first composite nitride layer in the chisel edge portion and the atomic ratio $M_{Cr}$ of the Cr element based on the total of the Al element and the Cr element in the first composite nitride layer in the margin portion satisfy the condition represented by formula (A) below:

$$C_{Cr} > M_{Cr} \qquad (A).$$

In the coated drill of the present embodiment, because the condition represented by formula (A) below is satisfied, the wear resistance of the chisel edge portion is improved and the wear resistance of the margin portion is improved. It is conceivable that the main factor is a decrease in friction wear coefficient in the coated drill of the present embodiment which is caused by $C_{Cr} > M_{Cr}$ and results in improved wear resistance of the chisel edge portion. Further, it is conceivable that the improvement of wear resistance of the margin portion is mainly due to an increase in hardness of the margin portion at high temperature which results from $C_{Cr} > M_{Cr}$. However, the present invention is not limited at all by these factors.

In the coated drill of the present embodiment, it is preferable that the difference ($C_{Cr} - M_{Cr}$) between the $C_{Cr}$ and the $M_{Cr}$ satisfy the condition represented by formula (B) below:

$$0.01 \leq C_{Cr} - M_{Cr} \leq 0.10 \qquad (B).$$

In the coated drill of the present embodiment, the wear resistance of the chisel edge portion and the margin portion is further improved because the condition represented by the formula (B) is satisfied. It is conceivable that the main factor is a decrease in friction wear coefficient in the coated drill of the present embodiment which is caused by ($C_{Cr} - M_{Cr}$) being 0.01 or more and results in improved wear resistance of the chisel edge portion. Further, it is conceivable that the improvement of wear resistance of the margin portion is mainly due to a further increase in hardness of the margin portion at high temperature which results from ($C_{Cr} - M_{Cr}$) being 0.01 or more. However, the present invention is not limited at all by these factors. Meanwhile, in the coated drill of the present embodiment, where the difference ($C_{Cr}$–$M_{Cr}$) between $C_{Cr}$ and $M_{Cr}$ is 0.10 or less, the wear resistance is further improved. As for the factor, in the coated drill of the present embodiment, it is conceivable that the wear resistance is further improved due to the difference ($C_{Cr}$–$M_{Cr}$) being 0.10 or less, but the present invention is not limited at all by this factor. From the same standpoints, it is more preferable that the difference ($C_{Cr}$–$M_{Cr}$) between the $C_{Cr}$ and the $M_{Cr}$ satisfy the condition represented by formula (C) below:

$$0.02 \leq C_{Cr} - M_{Cr} \leq 0.05 \quad (C).$$

In the coated drill of the present embodiment, where the average thickness of each of the layers of the first composite nitride layer and the second composite nitride layer is 70 nm or more, it is possible to suppress the increase in internal stress of the coating layer. As a result, the chipping resistance is improved. Meanwhile, in the coated drill of the present embodiment, where the average thickness of each of the layers of the first composite nitride layer and the second composite nitride layer is 300 nm or less, propagation of cracks toward the substrate can be suppressed. As a result, the chipping resistance is improved. From the same viewpoint, the average thickness of each of the layers of the first composite nitride layer and the second composite nitride layer is preferably 100 nm or more and 300 nm or less, and more preferably 150 nm or more and 250 nm or less.

Figure 4:
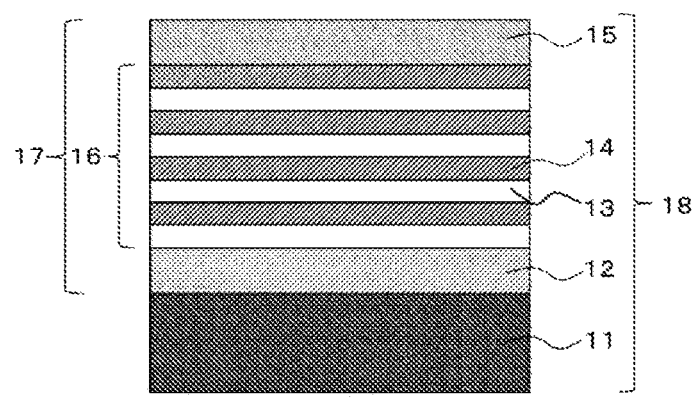
FIG. 4 is a schematic view showing an example of the coated drill of the present invention.

In the present embodiment, when the first composite nitride layer and the second composite nitride layer are formed each by one, the "number of repeats" is one, and the alternating laminate structure used in the present embodiment is inclusive of a mode in which the number of repeats is one. FIG. 4 is a schematic diagram showing an example of the cross-sectional structure of the coated drill of the present embodiment, and the number of repeats will be described below by using this schematic diagram. A coated drill 18 includes a substrate 11 and a coating layer 17 formed on the surface of the substrate 11. The coating layer 17 is formed by laminating a lower layer 12, which will be described hereinbelow, an alternating laminate structure 16, and an upper layer 15, which will be described later, in order of description from the substrate 11 side. The alternating laminate structure 16 is formed by alternately laminating a first composite nitride layer 13 and a second composite nitride layer 14 in the order of description from the lower layer 12 side to the upper layer 15 side, the first composite nitride layer 13 and the second composite nitride layer 14 each being laminated four times. In this case, the number of repeats is four. Further, when the first composite nitride layer is laminated five times and the second composite nitride layer is laminated five times, that is, the first composite nitride layer 13 and the second composite nitride layer 14 are sequentially formed from the lower layer 12 side to the upper layer 15 side in the order of the first composite nitride layer 13, the second composite nitride layer 14, the first composite nitride layer 13, the second composite nitride layer 14, the first composite nitride layer 13, the second composite nitride layer 14, the first composite nitride layer 13, the second composite nitride layer 14, the first composite nitride layer 13, and the second composite nitride layer 14, the number of repeats is five. Further, in FIG. 4, the coating layer 17 includes both the lower layer 12 and the upper layer 15, but the coating layer may include only either the lower layer 12 or the upper layer 15, or none of these layers.

In the coated drill of the present embodiment, where the average thickness of the alternating laminate structure is 1.50 μm or more, the wear resistance is further improved, and where the average thickness is 12.00 μm or less, the chipping resistance is further improved. Therefore, the average thickness of the alternating laminate structure is preferably 1.50 μm or more and 12.00 μm or less. Within this range, from the same viewpoint as above, the average thickness is more preferably 3.00 μm or more and 9.00 μm or less.

In the coated drill of the present embodiment, where the FWHM for the (200) plane in the X-ray diffraction of the second composite nitride layer is 0.4° or more, the chipping resistance is further improved. Meanwhile, when the FWHM for the (200) plane in the X-ray diffraction of the second composite nitride layer is 1.0° or less, the wear resistance is further improved. As for the casual factors, it is conceivable that the chipping resistance of the coated drill of the present embodiment is further improved mainly because the grains of the second composite nitride layer are refined when the FWHM for the (200) plane is 0.4° or more and that the wear resistance of the coated drill of the present embodiment is further improved mainly because lattice strains are small and excellent adhesiveness is realized when the FWHM for the (200) plane is 1.0° or less, but the present invention is not limited by these factors. Therefore, it is preferable that the FWHM for the (200) plane be 0.4° or more and 1.0° or less. Within this range, from the same viewpoint as above, the FWHM is more preferably 0.6° or more and 1.0° or less, and even more preferably 0.7° or more and 1.0° or less.

The FWHM for the (200) plane in the X-ray diffraction of the second composite nitride layer can be measured, for example, under the following measurement conditions.

Characteristic X ray: CuKα ray, monochromator: Ni, divergence slit: ½°, scattering slit: ⅔°, receiving slit: 0.15 mm, and sampling width: 0.01°.

The coating layer used in the present embodiment may be composed only of the alternating laminate structure of composite nitride layers, but it is preferable that the coating layer have a lower layer between the substrate and the alternating laminate structure (that is, the lower layer of the alternate laminates structure) because adhesiveness between the substrate and the alternating laminate structure is further improved. Among the materials of the lower layer, from the same viewpoints as described hereinabove, the lower layer preferably contains a compound including an element of at least one kind selected from the group consisting of Ti, Zr, Hf, V, Nb, Ta, Cr, Mo, W, Al, Si, and Y and an element of at least one kind selected from the group consisting of C, N, O and B, more preferably a compound including an element of at least one kind selected from the group consisting of Ti, V, Nb, Ta, Cr, Mo, W, Al, Si, and Y and an element of at least one kind selected from the group consisting of C, N, O and B, and even more preferably a compound including an element of at least one kind selected from the group consisting of Ti, Ta, Cr, W, Al, Si, and Y and N. Further, the lower layer may be a single layer or a multilayer (laminated) structure including two or more layers.

In the coated drill of the present embodiment, it is preferable that the average thickness of the lower layer be 0.1 μm or more and 3.5 μm or less because adhesiveness between the substrate and the coating layer tends to further improve. From the same viewpoint, the average thickness of the lower layer is more preferably 0.2 μm or more and 3.0 μm or less, and further preferably 0.3 μm or more and 2.5 μm or less.

The coating layer used in the present embodiment may have an upper layer on the side of the alternating laminate structure opposite that facing the substrate (that is, the upper layer of the alternating laminate structure), preferably on the surface of the alternating laminate structure. It is further preferable that the upper layer contains a compound including an element of at least one kind selected from the group consisting of Ti, Zr, Hf, V, Nb, Ta, Cr, Mo, W, Al, Si, and Y and an element of at least one kind selected from the group consisting of C, N, O and B because wear resistance is further improved. From the same viewpoints as described hereinabove, the upper layer preferably contains a compound including an element of at least one kind selected from the group consisting of Ti, Zr, Hf, V, Nb, Ta, Cr, Mo, W, Al, Si, and Y and an element of at least one kind selected from the group consisting of C, N, O and B, more preferably a compound including an element of at least one kind selected from the group consisting of Ti, V, Nb, Ta, Cr, Mo, W, Al, Si, and Y and an element of at least one kind selected from the group consisting of C, N, O and B, and even more preferably a compound including an element of at least one kind selected from the group consisting of Ti, Nb, Ta, Cr, W, Al, Si, and Y and N. Further, the upper layer may be a single layer or a multilayer (laminated) structure including two or more layers.

In the coated drill of the present embodiment, it is preferable that the average thickness of the upper layer be 0.1 μm or more and 3.5 μm or less because wear resistance tends to improve. From the same viewpoint, the average thickness of the upper layer is more preferably 0.2 μm or more and 3.0 μm or less, and further preferably 0.3 μm or more and 2.5 μm or less.

A method of manufacturing the coating layer used for the coated drill of the present embodiment is not particularly limited, and for example, physical vapor deposition methods such as an ion plating method, an arc ion plating method, a sputtering method, an ion mixing method, and the like can be used. It is preferable that the coating layer be formed using a physical vapor deposition method because a sharp edge can be formed. Among the physical vapor deposition method, the arc ion plating method is more preferable because excellent adhesiveness between the coating layer and the substrate is attained.

The method of manufacturing the coated drill of the present embodiment will be described below with reference to specific examples. The method of manufacturing the coated drill of the present embodiment is not particularly limited as long as the configuration of the coated drill can be achieved.

First, a substrate processed into a tool shape (drill shape) is received in a reactor of a physical vapor deposition apparatus, and a metal evaporation source is set in the reactor. Thereafter, the interior of the reactor is evacuated until the pressure becomes $1.0 \times 10^{-2}$ Pa or less, and the substrate is heated with a heater in the reactor until the substrate temperature reaches 200° C. to 700° C. After heating, Ar gas is introduced into the reactor to set the pressure inside the reactor to 0.5 Pa to 5.0 Pa. A bias voltage of −500 V to −350 V is applied to the substrate in the Ar gas atmosphere at a pressure of 0.5 Pa to 5.0 Pa and an electric current of 40 A to 50 A is passed through the tungsten filament in the reactor so that the surface of the substrate is subjected to ion bombardment treatment with Ar gas. After subjecting the surface of the substrate to ion bombardment treatment, the interior of the reactor is evacuated until the pressure reaches a vacuum of $1.0 \times 10^{-2}$ Pa or less.

In the case of forming the lower layer used in the present embodiment, the substrate is heated until its temperature reaches 400° C. to 600° C. After heating, a gas is introduced into the reactor, and the pressure inside the reactor is set to 0.5 Pa to 5.0 Pa. When the lower layer is configured of a compound including an element of at least one kind selected from the group consisting of Ti, Zr, Hf, V, Nb, Ta, Cr, Mo, W, Al, Si, and Y and N, the gas is exemplified by $N_2$, and when the lower layer is configured of a compound including an element of at least one kind selected from the group consisting of Ti, Zr, Hf, V, Nb, Ta, Cr, Mo, W, Al, Si, and Y and also N and C, the gas is exemplified by a mixed gas of $N_2$ and $C_2H_2$. The volume ratio of the mixed gas is not particularly limited and may be, for example, $N_2$ gas:$C_2H_2$ gas=95:5 to 85:15. Then, a bias voltage of −80 V to −40 V may be applied to the substrate, and a metal evaporation source corresponding to the metal component of each layer is evaporated by arc discharge with an arc current of 100 A to 200 A to form the lower layer.

In the case of forming the first composite nitride layer used in the present embodiment, the substrate is controlled so that the temperature reaches 400° C. to 600° C., a gas is introduced into the reactor, and the pressure inside the reactor is set to 0.5 Pa to 5.0 Pa. The gas is exemplified by a mixed gas of Ar gas and $N_2$ gas. The volume ratio of the mixed gas is not particularly limited and may be, for example, Ar gas:$N_2$ gas=20:80 to 80:20. Then, a bias voltage of −80 V to −40 V may be applied to the substrate, and a metal evaporation source corresponding to the metal component of the first composite nitride layer is evaporated by arc discharge with an arc current of 100 A to 200 A to form the first composite nitride layer.

In order for the coated drill of the present embodiment to satisfy the condition represented by the formula (A), the $C_{Cr}$ may be increased. In order to increase the $C_{Cr}$, for example, the pressure in the above reactor may be decreased or the volume ratio of the Ar gas in the mixed gas may be increased. Also, the $C_{Cr}$ can be increased by forming the first composite nitride layer in a state in which a portion of the substrate corresponding to the margin portion of the coated drill is disposed to face the metal evaporation source. In this case, the $C_{Cr}$ increases and the $M_{Cr}$ decreases.

In the case of forming the second composite nitride layer used in the present embodiment, the substrate is controlled so that the temperature thereof reaches 400° C. to 600° C. It is preferable that the temperature of the substrate be made equal to the temperature of the substrate when the first composite nitride layer is formed because the first composite nitride layer and the second composite nitride layer can be formed continuously. After the temperature has been controlled, a mixed gas same as that used when the first composite nitride layer is formed is introduced into the reactor, and the pressure inside the reactor is set to 0.5 Pa to 5.0 Pa. Then, a bias voltage of −80 V to −40 V may be applied to the substrate, and a metal evaporation source corresponding to the metal component of the second composite nitride layer is evaporated by arc discharge with an arc current of 100 A to 200 A to form the second composite nitride layer.

In order to form an alternating laminate structure of the first composite nitride layer and the second composite nitride layer, two or more kinds of metal evaporation sources may be alternately evaporated by arc discharge under the above-mentioned conditions, thereby alternately forming respective composite nitride layers. By adjusting the arc discharge time of the metal evaporation sources, the thickness of each composite nitride layer constituting the alternate laminate structure can be controlled.

In order to set the FWHM for the (200) plane in the X-ray diffraction in the second composite nitride layer used in the present embodiment to a predetermined value, it is possible to adjust the film formation temperature, or adjust the bias voltage, or adjust the lamination interval when the alternating laminate structure is formed. More specifically, when a lower film formation temperature is set, a higher negative bias voltage is applied, or the lamination interval is increased, the value of the FWHM for the (200) plane increases.

In the case of forming the upper layer used in the present embodiment, the upper layer may be formed under the same manufacturing conditions as the above-mentioned lower layer. That is, first, the substrate is heated until its temperature reaches 400° C. to 600° C. After heating, a gas is introduced into the reactor, and the pressure inside the reactor is set to 0.5 Pa to 5.0 Pa. When the lower layer is configured of a compound including an element of at least one kind selected from the group consisting of Ti, Zr, Hf, V, Nb, Ta, Cr, Mo, W, Al, Si, and Y and N, the gas is exemplified by $N_2$, and when the lower layer is configured of a compound including an element of at least one kind selected from the group consisting of Ti, Zr, Hf, V, Nb, Ta, Cr, Mo, W, Al, Si, and Y and also N and C, the gas is exemplified by a mixed gas of $N_2$ and $C_2H_2$. The volume ratio of the mixed gas is not particularly limited and may be, for example, $N_2$ gas:$C_2H_2$ gas=95:5 to 85:15. Then, a bias voltage of −80 V to −40 V may be applied to the substrate, and a metal evaporation source corresponding to the metal component of each layer is evaporated by arc discharge with an arc current of 100 A to 200 A to form the lower layer.

The thickness of each layer constituting the coating layer in the coated drill of the present embodiment can be measured from the cross-sectional structure of the coated drill by using an optical microscope, a scanning electron microscope (SEM), a transmission electron microscope (TEM), or the like. The average thickness of each layer in the coated drill of the present embodiment can be obtained by measuring the thickness of each layer from the cross sections at three or more locations in the chisel edge portion and calculating the average value (arithmetic average value) thereof.

The composition of each layer constituting the coating layer in the coated drill of the present embodiment can be also determined from the cross-sectional structure of the coated drill of the present embodiment by using an energy dispersive X-ray analyzer (EDS) or a wavelength dispersive X-ray analyzer (WDS).

It is conceivable that in the coated drill of the present embodiment, the effect of extending the tool life as compared with the related art is demonstrated due to excellent wear resistance and chipping resistance (however, factors which make it possible to extend the tool life are not limited to those described hereinabove).

EXAMPLES

Hereinafter, the present invention will be described in greater detail with reference to Examples, but the present invention is not limited to these Examples.

Example 1

A cemented carbide having a composition of 89.6% WC-9.8% Co-0.6% $Cr_3C_2$ (% by mass hereinabove) was prepared as a substrate by processing into an insert shape of DMP120 (made by Tungaloy Corporation). Metal evaporation sources corresponding to the composition of each layer shown in Tables 1 and 2 were arranged in the reactor of the arc ion plating apparatus so as to face the portion of the substrate corresponding to the margin portion when forming the coated drill of invention samples 1 to 32 and comparative samples 1, 2, 5 to 7, and 9 to 11. Meanwhile, for comparative samples 3, 4, 8, and 12, metal evaporation sources corresponding to the composition of each layer shown in Tables 1 and 2 were arranged in the reactor of the arc ion plating apparatus so as to face the portion of the substrate corresponding to the chisel edge portion. The prepared substrate was fixed to the fixing bracket of the rotary table in the reactor.

Thereafter, the inside of the reactor was evacuated until the pressure reached a vacuum of $5.0\times10^{-3}$ Pa or less. After evacuation, the substrate was heated with a heater in the reactor to a temperature of 450° C. After heating, Ar gas was introduced into the reactor such that the pressure became 2.7 Pa.

A bias voltage of −400 V was applied to the substrate in the Ar gas atmosphere at a pressure of 2.7 Pa and an electric current of 40 A was passed through the tungsten filament in the reactor so that the surface of the substrate was subjected to ion bombardment treatment with Ar gas. The treatment was performed for 30 min. After completing the ion bombardment treatment, the interior of the reactor was evacuated until the pressure reached a vacuum of $5.0\times10^{-3}$ Pa or less.

Regarding the invention samples 1 to 32, after evacuation, the substrate was controlled so that the temperature thereof reached the film formation temperature (temperature at the start of film formation) shown in Table 3, argon gas (Ar) and nitrogen gas ($N_2$) were introduced into the reactor at the volume ratio shown in Table 3, and the gas conditions were adjusted so that the inside of the reactor had the pressure shown in Table 3. Thereafter, the bias voltage shown in Table 3 was applied to the substrate, and the metal evaporation sources of the first composite nitride layer and the second composite nitride layer having the compositions shown in Table 1 were alternately evaporated by an arc discharge of a current (arc current) shown in Table 3 to form the first composite nitride layer and the second composite nitride layer alternately on the surface of the substrate. At this time, the gas condition and the pressure in the reactor were controlled to become such as shown in Table 3. The thickness of the first composite nitride layer and the thickness of the second composite nitride layer were controlled by adjusting the respective arc discharge time so as to obtain the thickness values shown in Table 1.

Regarding the comparative samples 1 and 2, after evacuation, the substrate was controlled so that the temperature thereof reached the film formation temperature (temperature at the start of film formation) shown in Table 4, argon gas (Ar) and nitrogen gas ($N_2$) were introduced into the reactor at the volume ratio shown in Table 4, and the gas conditions were adjusted so that the inside of the reactor had the pressure shown in Table 4. Thereafter, the bias voltage shown in Table 4 was applied to the substrate, and the metal evaporation source having the composition shown in Table 2 was evaporated by an arc discharge of an arc current shown in Table 4 to form a single layer (layer A or layer B) having the thickness shown in Table 2 on the surface of the substrate.

Regarding comparative samples 3 to 12, after evacuation, the substrate was controlled so that the temperature thereof reached the film formation temperature (temperature at the start of film formation) shown in Table 4, argon gas (Ar) and nitrogen gas ($N_2$) were introduced into the reactor at the volume ratio shown in Table 4, and the gas conditions were adjusted so that the inside of the reactor had the pressure shown in Table 4. Thereafter, the bias voltage shown in Table 4 was applied to the substrate, and the metal evaporation sources of the layer A and the layer B having the compositions shown in Table 2 were alternately evaporated by an arc discharge of a current (arc current) shown in Table 4 to form the layer A and the layer B alternately on the surface of the substrate. At this time, the gas condition and the pressure in the reactor were controlled to become such as shown in Table 4. The thickness of the layer A and the layer B were controlled by adjusting the respective arc discharge time so as to obtain the thickness values shown in Table 2.

After forming each layer to the predetermined average thickness shown in Tables 1 and 2 on the surface of the substrate, the power source of the heater was turned off, and after the sample temperature became 100° C. or lower, the sample was taken out from the reactor.

TABLE 1

| | Coating layer | | | | | | |
|---|---|---|---|---|---|---|---|
| | Alternating laminate structure | | | | | | |
| | First composite nitride layer | | Second composite nitride layer | | | | Average thickness of entire coating layer (μm) |
| Sample No. | Composition | Average thickness of each of layers (nm) | Composition | Average thickness of each of layers (nm) | Number of repeats (times) | Average thickness (μm) | |
| Invention sample 1 | $(Al_{0.70}Cr_{0.30})N$ | 150 | $(Ti_{0.80}Si_{0.20})N$ | 150 | 15 | 4.50 | 4.50 |
| Invention sample 2 | $(Al_{0.70}Cr_{0.30})N$ | 150 | $(Ti_{0.80}Si_{0.20})N$ | 150 | 15 | 4.50 | 4.50 |
| Invention sample 3 | $(Al_{0.70}Cr_{0.30})N$ | 150 | $(Ti_{0.80}Si_{0.20})N$ | 150 | 15 | 4.50 | 4.50 |
| Invention sample 4 | $(Al_{0.70}Cr_{0.30})N$ | 100 | $(Ti_{0.80}Si_{0.20})N$ | 100 | 22 | 4.40 | 4.40 |
| Invention sample 5 | $(Al_{0.70}Cr_{0.30})N$ | 70 | $(Ti_{0.80}Si_{0.20})N$ | 70 | 32 | 4.48 | 4.48 |
| Invention sample 6 | $(Al_{0.70}Cr_{0.30})N$ | 250 | $(Ti_{0.80}Si_{0.20})N$ | 250 | 9 | 4.50 | 4.50 |
| Invention sample 7 | $(Al_{0.85}Cr_{0.15})N$ | 150 | $(Ti_{0.80}Si_{0.20})N$ | 150 | 15 | 4.50 | 4.50 |
| Invention sample 8 | $(Al_{0.85}Cr_{0.15})N$ | 150 | $(Ti_{0.80}Si_{0.20})N$ | 150 | 15 | 4.50 | 4.50 |
| Invention sample 9 | $(Al_{0.85}Cr_{0.15})N$ | 100 | $(Ti_{0.80}Si_{0.20})N$ | 100 | 22 | 4.40 | 4.40 |
| Invention sample 10 | $(Al_{0.85}Cr_{0.15})N$ | 300 | $(Ti_{0.80}Si_{0.20})N$ | 300 | 8 | 4.80 | 4.80 |
| Invention sample 11 | $(Al_{0.70}Cr_{0.30})N$ | 150 | $(Ti_{0.90}Si_{0.10})N$ | 150 | 15 | 4.50 | 4.50 |
| Invention sample 12 | $(Al_{0.70}Cr_{0.30})N$ | 150 | $(Ti_{0.90}Si_{0.10})N$ | 150 | 15 | 4.50 | 4.50 |
| Invention sample 13 | $(Al_{0.70}Cr_{0.30})N$ | 150 | $(Ti_{0.90}Si_{0.10})N$ | 150 | 15 | 4.50 | 4.50 |
| Invention sample 14 | $(Al_{0.50}Cr_{0.50})N$ | 150 | $(Ti_{0.80}Si_{0.20})N$ | 150 | 15 | 4.50 | 4.50 |
| Invention sample 15 | $(Al_{0.50}Cr_{0.50})N$ | 150 | $(Ti_{0.80}Si_{0.20})N$ | 150 | 15 | 4.50 | 4.50 |
| Invention sample 16 | $(Al_{0.50}Cr_{0.50})N$ | 150 | $(Ti_{0.80}Si_{0.20})N$ | 150 | 15 | 4.50 | 4.50 |
| Invention sample 17 | $(Al_{0.70}Cr_{0.30})N$ | 150 | $(Ti_{0.70}Si_{0.30})N$ | 150 | 15 | 4.50 | 4.50 |
| Invention sample 18 | $(Al_{0.70}Cr_{0.30})N$ | 150 | $(Ti_{0.70}Si_{0.30})N$ | 150 | 15 | 4.50 | 4.50 |
| Invention sample 19 | $(Al_{0.70}Cr_{0.30})N$ | 150 | $(Ti_{0.70}Si_{0.30})N$ | 150 | 15 | 4.50 | 4.50 |
| Invention sample 20 | $(Al_{0.70}Cr_{0.30})N$ | 150 | $(Ti_{0.80}Si_{0.20})N$ | 150 | 30 | 9.00 | 9.00 |
| Invention sample 21 | $(Al_{0.70}Cr_{0.30})N$ | 100 | $(Ti_{0.80}Si_{0.20})N$ | 100 | 30 | 6.00 | 6.00 |
| Invention sample 22 | $(Al_{0.70}Cr_{0.30})N$ | 200 | $(Ti_{0.80}Si_{0.20})N$ | 200 | 5 | 2.00 | 2.00 |
| Invention sample 23 | $(Al_{0.85}Cr_{0.15})N$ | 150 | $(Ti_{0.90}Si_{0.10})N$ | 150 | 10 | 3.00 | 3.00 |
| Invention sample 24 | $(Al_{0.50}Cr_{0.50})N$ | 150 | $(Ti_{0.90}Si_{0.10})N$ | 150 | 10 | 3.00 | 3.00 |
| Invention sample 25 | $(Al_{0.85}Cr_{0.15})N$ | 200 | $(Ti_{0.90}Si_{0.10})N$ | 200 | 15 | 6.00 | 6.00 |
| Invention sample 26 | $(Al_{0.50}Cr_{0.50})N$ | 200 | $(Ti_{0.90}Si_{0.10})N$ | 200 | 15 | 6.00 | 6.00 |

TABLE 1-continued

| | Coating layer | | | | | |
|---|---|---|---|---|---|---|
| | Alternating laminate structure | | | | | |
| | First composite nitride layer | | Second composite nitride layer | | | | Average thickness of entire coating layer (μm) |
| Sample No. | Composition | Average thickness of each of layers (nm) | Composition | Average thickness of each of layers (nm) | Number of repeats (times) | Average thickness (μm) | Average thickness of entire coating layer (μm) |
|---|---|---|---|---|---|---|---|
| Invention sample 27 | $(Al_{0.70}Cr_{0.30})N$ | 150 | $(Ti_{0.95}Si_{0.05})N$ | 150 | 15 | 4.50 | 4.50 |
| Invention sample 28 | $(Al_{0.70}Cr_{0.30})N$ | 150 | $(Ti_{0.95}Si_{0.05})N$ | 150 | 15 | 4.50 | 4.50 |
| Invention sample 29 | $(Al_{0.70}Cr_{0.30})N$ | 150 | $(Ti_{0.95}Si_{0.05})N$ | 150 | 15 | 4.50 | 4.50 |
| Invention sample 30 | $(Al_{0.70}Cr_{0.30})N$ | 50 | $(Ti_{0.95}Si_{0.05})N$ | 50 | 45 | 4.50 | 4.50 |
| Invention sample 31 | $(Al_{0.70}Cr_{0.30})N$ | 20 | $(Ti_{0.95}Si_{0.05})N$ | 20 | 75 | 3.00 | 3.00 |
| Invention sample 32 | $(Al_{0.70}Cr_{0.30})N$ | 50 | $(Ti_{0.95}Si_{0.05})N$ | 50 | 60 | 6.00 | 6.00 |

TABLE 2

| | Coating layer | | | | | |
|---|---|---|---|---|---|---|
| | Alternating laminate structure | | | | | |
| | Layer A | | Layer B | | | | Average thickness of entire coating layer (μm) |
| Sample No. | Composition | Average thickness of each of layers (nm) | Composition | Average thickness of each of layers (nm) | Number of repeats (times) | Average thickness (μm) | Average thickness of entire coating layer (μm) |
|---|---|---|---|---|---|---|---|
| Comparative sample 1 | $(Al_{0.70}Cr_{0.30})N$ | 4500 | — | — | 1 | 4.50 | 4.50 |
| Comparative sample 2 | — | — | $(Ti_{0.85}Si_{0.15})N$ | 4500 | 1 | 4.50 | 4.50 |
| Comparative sample 3 | $(Al_{0.70}Cr_{0.30})N$ | 150 | $(Ti_{0.85}Si_{0.15})N$ | 150 | 15 | 4.50 | 4.50 |
| Comparative sample 4 | $(Al_{0.70}Cr_{0.30})N$ | 150 | $(Ti_{0.85}Si_{0.15})N$ | 150 | 15 | 4.50 | 4.50 |
| Comparative sample 5 | AlN | 150 | $(Ti_{0.85}Si_{0.15})N$ | 150 | 15 | 4.50 | 4.50 |
| Comparative sample 6 | $(Al_{0.70}Cr_{0.30})N$ | 150 | TiN | 150 | 15 | 4.50 | 4.50 |
| Comparative sample 7 | $(Al_{0.70}Cr_{0.30})N$ | 150 | $(Ti_{0.60}Si_{0.40})N$ | 150 | 15 | 4.50 | 4.50 |
| Comparative sample 8 | $(Al_{0.50}Cr_{0.50})N$ | 500 | $(Ti_{0.85}Si_{0.15})N$ | 500 | 5 | 5.00 | 5.00 |
| Comparative sample 9 | $(Al_{0.85}Cr_{0.15})N$ | 300 | $(Ti_{0.85}Si_{0.15})N$ | 300 | 4 | 2.40 | 2.40 |
| Comparative sample 10 | $(Ti_{0.50}Al_{0.50})N$ | 150 | $(Ti_{0.85}Si_{0.15})N$ | 150 | 15 | 4.50 | 4.50 |
| Comparative sample 11 | $(Al_{0.70}Cr_{0.30})N$ | 150 | $(Ti_{0.50}Al_{0.50})N$ | 150 | 15 | 4.50 | 4.50 |
| Comparative sample 12 | $(Al_{0.70}Cr_{0.30})N$ | 50 | $(Ti_{0.95}Si_{0.05})N$ | 50 | 45 | 4.50 | 4.50 |

* "—" in the columns of "Layer A" and "Layer B" means that the layer is not formed.

TABLE 3

| Sample No. | Surface facing metal deposition source | Temperature (° C.) | Bias voltage (V) | Current (A) | Pressure (Pa) | Ar:N$_2$ (% by volume) |
|---|---|---|---|---|---|---|
| Invention sample 1 | Margin side | 500 | 60 | 200 | 3.0 | 40:60 |
| Invention sample 2 | Margin side | 500 | 60 | 200 | 2.0 | 80:20 |
| Invention sample 3 | Margin side | 500 | 60 | 200 | 4.0 | 20:80 |
| Invention sample 4 | Margin side | 500 | 60 | 200 | 3.0 | 40:60 |
| Invention sample 5 | Margin side | 500 | 60 | 200 | 3.0 | 40:60 |
| Invention sample 6 | Margin side | 500 | 60 | 200 | 3.0 | 40:60 |
| Invention sample 7 | Margin side | 500 | 60 | 200 | 3.0 | 40:60 |
| Invention sample 8 | Margin side | 500 | 60 | 200 | 4.0 | 20:80 |
| Invention sample 9 | Margin side | 500 | 60 | 200 | 3.0 | 40:60 |
| Invention sample 10 | Margin side | 500 | 60 | 200 | 3.0 | 40:60 |
| Invention sample 11 | Margin side | 500 | 60 | 150 | 3.0 | 40:60 |
| Invention sample 12 | Margin side | 500 | 60 | 200 | 2.0 | 80:20 |
| Invention sample 13 | Margin side | 500 | 60 | 200 | 4.0 | 20:80 |
| Invention sample 14 | Margin side | 500 | 60 | 200 | 3.0 | 40:60 |
| Invention sample 15 | Margin side | 500 | 60 | 200 | 2.0 | 80:20 |
| Invention sample 16 | Margin side | 500 | 60 | 200 | 4.0 | 20:80 |
| Invention sample 17 | Margin side | 500 | 60 | 200 | 3.0 | 40:60 |
| Invention sample 18 | Margin side | 500 | 60 | 200 | 2.0 | 80:20 |
| Invention sample 19 | Margin side | 500 | 60 | 200 | 4.0 | 20:80 |
| Invention sample 20 | Margin side | 600 | 60 | 180 | 3.0 | 40:60 |
| Invention sample 21 | Margin side | 500 | 60 | 200 | 3.0 | 40:60 |
| Invention sample 22 | Margin side | 500 | 60 | 200 | 3.0 | 40:60 |
| Invention sample 23 | Margin side | 600 | 40 | 200 | 4.0 | 20:80 |
| Invention sample 24 | Margin side | 500 | 60 | 200 | 4.0 | 20:80 |
| Invention sample 25 | Margin side | 450 | 80 | 200 | 4.0 | 20:80 |
| Invention sample 26 | Margin side | 400 | 60 | 200 | 4.0 | 20:80 |
| Invention sample 27 | Margin side | 400 | 80 | 150 | 3.0 | 40:60 |
| Invention sample 28 | Margin side | 400 | 60 | 200 | 2.0 | 80:20 |
| Invention sample 29 | Margin side | 400 | 80 | 200 | 4.0 | 20:80 |
| Invention sample 30 | Margin side | 500 | 60 | 150 | 3.0 | 40:60 |
| Invention sample 31 | Margin side | 550 | 40 | 200 | 2.0 | 80:20 |
| Invention sample 32 | Margin side | 400 | 40 | 200 | 2.0 | 80:20 |

TABLE 4

| Sample No. | Surface facing metal deposition source | Temperature (° C.) | Bias voltage (V) | Current (A) | Pressure (Pa) | Ar:N$_2$ (% by volume) |
|---|---|---|---|---|---|---|
| Comparative sample 1 | Margin side | 500 | 60 | 200 | 3.0 | 40:60 |
| Comparative sample 2 | Margin side | 500 | 60 | 200 | 3.0 | 0:100 |
| Comparative sample 3 | Chisel edge side | 500 | 80 | 200 | 2.0 | 80:20 |
| Comparative sample 4 | Chisel edge side | 300 | 60 | 200 | 1.5 | 90:10 |
| Comparative sample 5 | Margin side | 500 | 60 | 200 | 3.0 | 0:100 |
| Comparative sample 6 | Margin side | 500 | 60 | 200 | 3.0 | 40:60 |
| Comparative sample 7 | Margin side | 500 | 60 | 200 | 2.0 | 80:20 |
| Comparative sample 8 | Chisel edge side | 500 | 60 | 200 | 1.5 | 90:10 |
| Comparative sample 9 | Margin side | 400 | 60 | 150 | 2.0 | 80:20 |
| Comparative sample 10 | Margin side | 500 | 60 | 200 | 3.0 | 0:100 |
| Comparative sample 11 | Margin side | 500 | 60 | 200 | 4.0 | 20:80 |
| Comparative sample 12 | Chisel edge side | 450 | 40 | 150 | 1.5 | 90:10 |

The average thickness of each layer of the obtained sample was determined by performing TEM observation of three cross sections at the chisel edge portion of the coated drill, measuring the thickness of each layer, and calculating the average value (arithmetic average value) thereof. The results are also shown in Tables 1 and 2.

The composition of each layer of the obtained sample was measured at the chisel edge portion of the coated drill by using the EDS attached to the TEM. The results are also shown in Tables 1 and 2. The composition ratio of the metal elements in each layer in Tables 1 and 2 indicates the atomic ratio of each metal element based on the total of metal elements in the metal compound constituting each layer. The composition of the second composite nitride layer in the margin portion of the obtained sample was the same as the composition of the second composite nitride layer in the chisel edge portion shown in Table 1.

Further, with respect to the first composite nitride layer or the layer A of the obtained sample, measurement was carried out by using the EDS attached to the TEM in each cross section of the chisel edge portion and the margin portion of the coated drill, and based on the obtained measurement value, the $C_{Cr}$ and $M_{Cr}$ were calculated. The measurement results are shown in Tables 5 and 6. Although the composition of the first composite nitride layer or the layer A in the margin portion of the obtained sample is not clearly indicated, for example, the composition of the layer A in the margin portion of the comparative sample 9 is $(Al_{0.95}Cr_{0.05})N$ because the atomic ratio $M_{Cr}$ of the Cr element based on the total of the Al element and the Cr element in the layer A in the margin portion is 0.05.

TABLE 5

| | First composite nitride layer | | | |
|---|---|---|---|---|
| Sample No. | $C_{Cr}$ | $M_{Cr}$ | Difference ($C_{Cr}$ − $M_{Cr}$) between $C_{Cr}$ and $M_{Cr}$ | Relationship between $C_{Cr}$ and $M_{Cr}$ |
| Invention sample 1 | 0.30 | 0.25 | 0.05 | $C_{Cr} > M_{Cr}$ |
| Invention sample 2 | 0.30 | 0.20 | 0.10 | $C_{Cr} > M_{Cr}$ |
| Invention sample 3 | 0.30 | 0.28 | 0.02 | $C_{Cr} > M_{Cr}$ |
| Invention sample 4 | 0.30 | 0.25 | 0.05 | $C_{Cr} > M_{Cr}$ |
| Invention sample 5 | 0.30 | 0.25 | 0.05 | $C_{Cr} > M_{Cr}$ |
| Invention sample 6 | 0.30 | 0.25 | 0.05 | $C_{Cr} > M_{Cr}$ |
| Invention sample 7 | 0.15 | 0.10 | 0.05 | $C_{Cr} > M_{Cr}$ |
| Invention sample 8 | 0.15 | 0.13 | 0.02 | $C_{Cr} > M_{Cr}$ |
| Invention sample 9 | 0.15 | 0.10 | 0.05 | $C_{Cr} > M_{Cr}$ |
| Invention sample 10 | 0.15 | 0.10 | 0.05 | $C_{Cr} > M_{Cr}$ |
| Invention sample 11 | 0.30 | 0.25 | 0.05 | $C_{Cr} > M_{Cr}$ |
| Invention sample 12 | 0.30 | 0.20 | 0.10 | $C_{Cr} > M_{Cr}$ |
| Invention sample 13 | 0.30 | 0.28 | 0.02 | $C_{Cr} > M_{Cr}$ |
| Invention sample 14 | 0.50 | 0.45 | 0.05 | $C_{Cr} > M_{Cr}$ |
| Invention sample 15 | 0.50 | 0.40 | 0.10 | $C_{Cr} > M_{Cr}$ |
| Invention sample 16 | 0.50 | 0.48 | 0.02 | $C_{Cr} > M_{Cr}$ |
| Invention sample 17 | 0.30 | 0.25 | 0.05 | $C_{Cr} > M_{Cr}$ |
| Invention sample 18 | 0.30 | 0.20 | 0.10 | $C_{Cr} > M_{Cr}$ |

TABLE 5-continued

First composite nitride layer

| Sample No. | $C_{Cr}$ | $M_{Cr}$ | Difference ($C_{Cr} - M_{Cr}$) between $C_{Cr}$ and $M_{Cr}$ | Relationship between $C_{Cr}$ and $M_{Cr}$ |
|---|---|---|---|---|
| Invention sample 19 | 0.30 | 0.28 | 0.02 | $C_{Cr} > M_{Cr}$ |
| Invention sample 20 | 0.30 | 0.25 | 0.05 | $C_{Cr} > M_{Cr}$ |
| Invention sample 21 | 0.30 | 0.25 | 0.05 | $C_{Cr} > M_{Cr}$ |
| Invention sample 22 | 0.30 | 0.25 | 0.05 | $C_{Cr} > M_{Cr}$ |
| Invention sample 23 | 0.15 | 0.13 | 0.02 | $C_{Cr} > M_{Cr}$ |
| Invention sample 24 | 0.50 | 0.48 | 0.02 | $C_{Cr} > M_{Cr}$ |
| Invention sample 25 | 0.15 | 0.13 | 0.02 | $C_{Cr} > M_{Cr}$ |
| Invention sample 26 | 0.50 | 0.48 | 0.02 | $C_{Cr} > M_{Cr}$ |
| Invention sample 27 | 0.30 | 0.25 | 0.05 | $C_{Cr} > M_{Cr}$ |
| Invention sample 28 | 0.30 | 0.20 | 0.10 | $C_{Cr} > M_{Cr}$ |
| Invention sample 29 | 0.30 | 0.28 | 0.02 | $C_{Cr} > M_{Cr}$ |
| Invention sample 30 | 0.30 | 0.25 | 0.05 | $C_{Cr} > M_{Cr}$ |
| Invention sample 31 | 0.30 | 0.20 | 0.10 | $C_{Cr} > M_{Cr}$ |
| Invention sample 32 | 0.30 | 0.20 | 0.10 | $C_{Cr} > M_{Cr}$ |

TABLE 6

Layer A

| Sample No. | $C_{Cr}$ | $M_{Cr}$ | Difference ($C_{Cr} - M_{Cr}$) between $C_{Cr}$ and $M_{Cr}$ | Relationship between $C_{Cr}$ and $M_{Cr}$ |
|---|---|---|---|---|
| Comparative sample 1 | 0.30 | 0.25 | 0.05 | $C_{Cr} > M_{Cr}$ |
| Comparative sample 2 | — | — | — | — |
| Comparative sample 3 | 0.30 | 0.40 | −0.10 | $M_{Cr} > Cr_{Cr}$ |
| Comparative sample 4 | 0.30 | 0.45 | −0.15 | $M_{Cr} > Cr_{Cr}$ |
| Comparative sample 5 | — | — | — | — |
| Comparative sample 6 | 0.30 | 0.25 | 0.05 | $C_{Cr} > M_{Cr}$ |
| Comparative sample 7 | 0.30 | 0.20 | 0.10 | $C_{Cr} > M_{Cr}$ |
| Comparative sample 8 | 0.50 | 0.65 | −0.15 | $M_{Cr} > Cr_{Cr}$ |
| Comparative sample 9 | 0.15 | 0.05 | 0.10 | $C_{Cr} > M_{Cr}$ |
| Comparative sample 10 | — | — | — | — |
| Comparative sample 11 | 0.30 | 0.28 | 0.02 | $C_{Cr} > M_{Cr}$ |
| Comparative sample 12 | 0.30 | 0.45 | −0.15 | $M_{Cr} > Cr_{Cr}$ |

The FWHM for the (200) plane in the second composite nitride layer or the layer B of the obtained sample was measured under the following measurement conditions. The results are shown in Tables 7 and 8.

Characteristic X ray: CuKα ray, monochromator: Ni, divergence slit: ½°, scattering slit: ⅔°, receiving slit: 0.15 mm, and sampling width: 0.01°.

TABLE 7

| Sample No. | Second nitride composite layer FWHM (°) of (200) plane |
|---|---|
| Invention sample 1 | 0.7 |
| Invention sample 2 | 0.7 |
| Invention sample 3 | 0.7 |
| Invention sample 4 | 0.8 |
| Invention sample 5 | 0.9 |
| Invention sample 6 | 0.5 |
| Invention sample 7 | 0.7 |
| Invention sample 8 | 0.7 |
| Invention sample 9 | 0.8 |
| Invention sample 10 | 0.4 |
| Invention sample 11 | 0.7 |
| Invention sample 12 | 0.7 |
| Invention sample 13 | 0.7 |
| Invention sample 14 | 0.7 |
| Invention sample 15 | 0.7 |
| Invention sample 16 | 0.7 |
| Invention sample 17 | 0.7 |
| Invention sample 18 | 0.7 |
| Invention sample 19 | 0.7 |
| Invention sample 20 | 0.5 |
| Invention sample 21 | 0.8 |
| Invention sample 22 | 0.6 |
| Invention sample 23 | 0.6 |
| Invention sample 24 | 0.7 |
| Invention sample 25 | 0.8 |
| Invention sample 26 | 0.8 |
| Invention sample 27 | 0.9 |
| Invention sample 28 | 0.8 |
| Invention sample 29 | 1.0 |
| Invention sample 30 | 0.9 |
| Invention sample 31 | 0.8 |
| Invention sample 32 | 1.0 |

TABLE 8

| Sample No. | Layer B FWHM (°) of (200) plane |
|---|---|
| Comparative sample 1 | — |
| Comparative sample 2 | 0.5 |
| Comparative sample 3 | 0.4 |
| Comparative sample 4 | 1.2 |
| Comparative sample 5 | 0.7 |
| Comparative sample 6 | — |
| Comparative sample 7 | 0.7 |
| Comparative sample 8 | 0.6 |
| Comparative sample 9 | 0.6 |
| Comparative sample 10 | 0.7 |
| Comparative sample 11 | — |
| Comparative sample 12 | 0.9 |

The obtained samples were evaluated by performing the following cutting test.

Cutting Test
Workpiece: S55C (200 HB) Workpiece shape: rectangular parallelepiped block of 150 mm×200 mm×40 mm
Machining form: blind hole
Cutting speed: 110 m/min
Feed rate per one revolution: 0.27 mm/rev
Coolant: water-soluble (internal lubrication method)
Evaluation items: when a chisel edge was chipped (chipping occurred in the chisel edge) (indicated as "Chipping" in the table), when a feed mark was generated in the margin part, or when the flank wear reached 0.3 mm, (indicated as "Normal wear" in the table), it was defined as the tool life, and the machining length up to the tool life was measured.

The machining length up to the tool life in the cutting test was rated "A" at 100 m or more, "B" at 60 m or more and less than 100 m, and "C" at less than 60 m. In this evaluation, "A" is the best, "B" is the second best, and "C" is the worst, which means that the more evaluations of "A" or "B" the better the cutting performance. Specifically, large machining length means excellent chipping resistance and wear resistance. The results of the evaluation obtained are shown in Tables 9 and 10.

TABLE 9

| | Cutting test | | |
|---|---|---|---|
| Sample No. | Machining length (m) | Evaluation | Defect form |
| Invention sample 1 | 141 | A | Normal wear |
| Invention sample 2 | 147 | A | Normal wear |
| Invention sample 3 | 138 | A | Normal wear |
| Invention sample 4 | 115 | A | Normal wear |
| Invention sample 5 | 90 | B | Normal wear |
| Invention sample 6 | 145 | A | Normal wear |
| Invention sample 7 | 120 | A | Normal wear |
| Invention sample 8 | 116 | A | Normal wear |
| Invention sample 9 | 94 | B | Normal wear |
| Invention sample 10 | 124 | A | Normal wear |
| Invention sample 11 | 120 | A | Normal wear |
| Invention sample 12 | 125 | A | Normal wear |
| Invention sample 13 | 116 | A | Normal wear |
| Invention sample 14 | 137 | A | Normal wear |
| Invention sample 15 | 144 | A | Normal wear |
| Invention sample 16 | 132 | A | Normal wear |
| Invention sample 17 | 118 | A | Normal wear |
| Invention sample 18 | 124 | A | Normal wear |
| Invention sample 19 | 114 | A | Normal wear |
| Invention sample 20 | 164 | A | Normal wear |
| Invention sample 21 | 128 | A | Normal wear |
| Invention sample 22 | 95 | B | Normal wear |
| Invention sample 23 | 81 | B | Normal wear |
| Invention sample 24 | 69 | B | Normal wear |
| Invention sample 25 | 124 | A | Normal wear |
| Invention sample 26 | 133 | A | Normal wear |
| Invention sample 27 | 108 | A | Normal wear |
| Invention sample 28 | 111 | A | Normal wear |
| Invention sample 29 | 104 | A | Normal wear |
| Invention sample 30 | 85 | B | Normal wear |
| Invention sample 31 | 80 | B | Normal wear |
| Invention sample 32 | 96 | B | Normal wear |

TABLE 10

| | Cutting test | | |
|---|---|---|---|
| Sample No. | Machining length (m) | Evaluation | Defect form |
| Comparative sample 1 | 10 | C | Chipping |
| Comparative sample 2 | 7 | C | Chipping |
| Comparative sample 3 | 46 | C | Chipping |
| Comparative sample 4 | 40 | C | Chipping |
| Comparative sample 5 | 28 | C | Chipping |
| Comparative sample 6 | 35 | C | Chipping |
| Comparative sample 7 | 59 | C | Chipping |
| Comparative sample 8 | 59 | C | Chipping |
| Comparative sample 9 | 52 | C | Chipping |
| Comparative sample 10 | 29 | C | Chipping |
| Comparative sample 11 | 31 | C | Chipping |
| Comparative sample 12 | 55 | C | Chipping |

From the results shown in Tables 9 and 10, the evaluation of all of the invention samples in the cutting test was "A" or "B", and the evaluation of all of the comparative samples was "C".

From the above results, it is understood that the tool life of the invention samples is extended by improving the wear resistance and chipping resistance.

Example 2

A cemented carbide having a composition of 89.6% WC-9.8% Co-0.6% $Cr_3C_2$ (% by mass hereinabove) was prepared as a substrate by machining into an insert shape of DMP120 (made by Tungaloy Corporation). Metal evaporation sources corresponding to the composition of each layer shown in Table 11 were arranged in the reactor of the arc ion plating apparatus so as to face the portion of the substrate corresponding to the margin portion when forming the coated drill. The prepared substrate was fixed to the fixing bracket of the rotary table in the reactor.

Thereafter, the inside of the reactor was evacuated until the pressure reached a vacuum of $5.0 \times 10^{-3}$ Pa or less. After evacuation, the substrate was heated with a heater in the reactor to a temperature of 450° C. After heating, Ar gas was introduced into the reactor such that the pressure became 2.7 Pa.

A bias voltage of −400 V was applied to the substrate in the Ar gas atmosphere at a pressure of 2.7 Pa and an electric current of 40 A was passed through the tungsten filament in the reactor so that the surface of the substrate was subjected to ion bombardment treatment with Ar gas. The treatment was performed for 30 min. After completing the ion bombardment treatment, the interior of the reactor was evacuated until the pressure reached a vacuum of $5.0 \times 10^{-3}$ Pa or less.

Regarding the invention samples 33, 34, and 36 to 46, after evacuation, the substrate was heated so that the temperature thereof reached the film formation temperature (temperature at the start of film formation) shown in Table 12, and a gas was introduced into the reactor so that the pressure in the reactor reached 3.0 Pa. Here, for invention samples 33, 34, 36 to 41, and 43 to 46, $N_2$ gas was introduced as the gas, and for invention sample 42, a mixed gas including $N_2$ gas and $C_2H_2$ gas at a volume ratio of 90:10 was introduced as the gas. Thereafter, the bias voltage shown in Table 12 was applied to the substrate, and the metal evaporation source having the composition shown in Table 11 was evaporated by the arc discharge of the arc current shown in Table 12 to form the lower layer.

Next, the first composite nitride layer and the second composite nitride layer were alternately formed on the lower layer or the surface of the substrate to obtain invention samples 33 to 35 under the same manufacturing conditions as those of the alternating laminate structure of invention sample 1, to obtain invention samples 36 to 38 under the same manufacturing conditions as those of the alternating laminate structure of invention sample 11, to obtain invention samples 39 to 42 under the same manufacturing conditions as those of the alternating laminate structure of invention sample 23, and to obtain invention samples 43 to 46 under the same manufacturing conditions as those of the alternating laminate structure of invention sample 25.

The sample numbers described in the alternating laminate structure of invention samples 33 to 46 in Table 11 indicate that the alternating laminate structure of each of invention samples 33 to 46 and the alternating laminate structure of the corresponding sample numbers are the same. For example, the alternating laminate structure of invention sample 33 is the same as the alternating laminate structure of invention sample 1.

Next, regarding the invention samples 34 to 36 and 38 to 46, after evacuation, the substrate was heated so that the temperature thereof reached the film formation temperature (temperature at the start of film formation) shown in Table 12, and a gas was introduced into the reactor so that the pressure in the reactor reached the pressure shown in Table 12. Here, for invention samples 34 to 36, 38, and 40 to 46, $N_2$ gas was introduced as the gas, and for invention sample 39, a mixed gas including $N_2$ gas and $C_2H_2$ gas at a volume ratio of 90:10 was introduced as the gas. Thereafter, the bias voltage shown in Table 12 was applied to the substrate, and the metal evaporation source having the composition shown in Table 11 was evaporated by the arc discharge of the arc current shown in Table 12 to form the upper layer.

After forming each layer to the predetermined average thickness shown in Table 11 on the surface of the substrate, the power source of the heater was turned off, and after the sample temperature became 100° C. or lower, the sample was taken out from the reactor.

TABLE 11

| | Coating layer | | | | | | |
|---|---|---|---|---|---|---|---|
| | Lower layer | | Alternating laminate structure | | Upper layer | | Average thickness of entire configuration (μm) |
| Sample No. | Composition | Average thickness (μm) | Sample No. | Average thickness (μm) | Composition | Average thickness (μm) | |
| Invention sample 33 | $(Ti_{0.40}Al_{0.60})N$ | 0.5 | Invention sample 1 | 4.5 | — | | 5.0 |
| Invention sample 34 | $(Ti_{0.60}Al_{0.40})N$ | 1.2 | Invention sample 1 | 4.5 | $(Ti_{0.40}Al_{0.60})N$ | 0.3 | 6.0 |
| Invention sample 35 | — | — | Invention sample 1 | 4.5 | $(Ti_{0.50}Al_{0.30}Cr_{0.15}Si_{0.05})N$ | 1.5 | 6.0 |
| Invention sample 36 | TiN | 2.0 | Invention sample 11 | 4.5 | AlN | 1.0 | 7.5 |
| Invention sample 37 | $(Ti_{0.90}W_{0.10})N$ | 3.0 | Invention sample 11 | 4.5 | — | | 7.5 |
| Invention sample 38 | $(Ti_{0.50}Al_{0.30}Cr_{0.15}Si_{0.05})N$ | 0.5 | Invention sample 11 | 4.5 | $(Ti_{0.60}Al_{0.40})N$ | 2.5 | 7.5 |
| Invention sample 39 | $(Ti_{0.70}Al_{0.20}W_{0.10})N$ | 1.0 | Invention sample 23 | 3.0 | TiCN | 1.0 | 5.0 |
| Invention sample 40 | $(Ti_{0.60}Al_{0.35}Y_{0.05})N$ | 0.5 | Invention sample 23 | 3.0 | $(Ti_{0.50}Al_{0.40}Ta_{0.10})N$ | 1.5 | 5.0 |
| Invention sample 41 | AlN | 1.7 | Invention sample 23 | 3.0 | $(Ti_{0.90}Nb_{0.10})N$ | 0.3 | 5.0 |
| Invention sample 42 | TiCN | 1.0 | Invention sample 23 | 3.0 | $(Ti_{0.50}Al_{0.40}Nb_{0.10})N$ | 1.0 | 5.0 |
| Invention sample 43 | $(Ti_{0.90}Nb_{0.10})N$ | 1.0 | Invention sample 25 | 6.0 | TiN | 1.0 | 8.0 |
| Invention sample 44 | $(Ti_{0.50}Al_{0.40}Si_{0.10})N$ | 1.0 | Invention sample 25 | 6.0 | $(Ti_{0.90}W_{0.10})N$ | 1.0 | 8.0 |
| Invention sample 45 | $(Ti_{0.90}W_{0.10})N$ | 1.0 | Invention sample 25 | 6.0 | $(Ti_{0.50}Al_{0.40}Si_{0.10})N$ | 1.0 | 8.0 |
| Invention sample 46 | $(Ti_{0.50}Al_{0.40}Ta_{0.10})N$ | 1.0 | Invention sample 25 | 6.0 | AlN | 1.0 | 8.0 |

* "—" in the columns of "Lower layer" and "Upper layer" means that the lower layer or the upper layer is not formed.

TABLE 12

| | Production conditions (upper layer and lower layer) | | | |
|---|---|---|---|---|
| Sample No. | Film formation temperature (° C.) | Pressure (Pa) | Bias voltage (V) | Arc current (A) |
| Invention sample 33 | 500 | 3.0 | 60 | 150 |
| Invention sample 34 | 500 | 3.0 | 60 | 150 |
| Invention sample 35 | 500 | 3.0 | 60 | 150 |
| Invention sample 36 | 500 | 3.0 | 40 | 150 |
| Invention sample 37 | 500 | 3.0 | 40 | 150 |
| Invention sample 38 | 500 | 3.0 | 40 | 150 |
| Invention sample 39 | 400 | 3.0 | 60 | 150 |
| Invention sample 40 | 400 | 3.0 | 60 | 150 |
| Invention sample 41 | 400 | 3.0 | 60 | 150 |
| Invention sample 42 | 400 | 3.0 | 60 | 150 |
| Invention sample 43 | 500 | 3.0 | 80 | 150 |
| Invention sample 44 | 500 | 3.0 | 80 | 150 |
| Invention sample 45 | 500 | 3.0 | 80 | 150 |
| Invention sample 46 | 500 | 3.0 | 80 | 150 |

The average thickness of each layer of the obtained sample was obtained by performing TEM observation of three cross sections at the chisel edge portion of the coated drill, measuring the thickness of each layer, and calculating the average value (arithmetic average value) thereof. The results are also shown in Table 11.

The compositions of the lower layer and the upper layer of the obtained sample were measured at the chisel edge portion of the coated drill by using the EDS attached to the TEM. The results are also shown in Table 11. The composition ratio of the metal elements in each layer in Table 11 indicates the atomic ratio of each metal element based on the total of metal elements in the metal compound constituting each layer.

The relationship between $M_{Cr}$ and $C_{Cr}$ in the first composite nitride layer of each of invention samples 33 to 46, the FWHM(° of the (200) plane in the second composite nitride layer, and the average thickness of the alternating laminate structure were the same as the characteristics of the alternating laminate structure of the sample numbers described in the corresponding alternating laminate structure.

The obtained samples were used to perform the cutting test and evaluation in the same manner as in Example 1. The machining length up to the tool life in the cutting test was rated "A" at 100 m or more, "B" at 60 m or more and less than 100 m, and "C" at less than 60 m. In this evaluation, "A" is the best, "B" is the second best, and "C" is the worst, which means that the more evaluations of "A" or "B" are, the better the cutting performance is. Specifically, a large machining length means excellent chipping resistance and wear resistance. The results of the evaluation obtained are shown in Table 13.

TABLE 13

| Sample No. | Cutting test | | |
|---|---|---|---|
| | Machining length (m) | Evaluation | Defect form |
| Invention sample 33 | 151 | A | Normal wear |
| Invention sample 34 | 157 | A | Normal wear |
| Invention sample 35 | 148 | A | Normal wear |
| Invention sample 36 | 132 | A | Normal wear |
| Invention sample 37 | 134 | A | Normal wear |
| Invention sample 38 | 137 | A | Normal wear |
| Invention sample 39 | 95 | B | Normal wear |
| Invention sample 40 | 93 | B | Normal wear |
| Invention sample 41 | 90 | B | Normal wear |
| Invention sample 42 | 139 | A | Normal wear |
| Invention sample 43 | 135 | A | Normal wear |
| Invention sample 44 | 138 | A | Normal wear |
| Invention sample 45 | 137 | A | Normal wear |
| Invention sample 46 | 134 | A | Normal wear |

From the results shown in Table 13, the evaluation was "A" in all of the cutting tests.

Therefore, it is understood that the invention samples have excellent wear resistance and chipping resistance even when the invention samples have an upper layer and/or a lower layer, and the tool life is extended.

INDUSTRIAL APPLICABILITY

The coated drill of the present invention is excellent in wear resistance and chipping resistance, so that tool life can be extended as compared with the conventional one. Therefore, the coated drill has high industrial applicability.

REFERENCE SIGNS LIST

1: Cutting portion, 2: Holding portion, 3: Tip cutting edge ridge, 4: First flank, 5: Oil hole, 6: Second flank, 7: Cross thinning, 8: Chisel edge portion, 9: Twist groove, 10: Margin portion, 11: Substrate, 12: Lower layer, 13: First composite nitride layer, 14: Second composite nitride layer, 15: Upper layer, 16: Alternating laminate structure, 17: Coating layer, 18: Coated drill, 100: Drill

What is claimed is:

1. A coated drill comprising: a substrate; and a coating layer formed on the substrate, wherein
   the coated drill has a chisel edge portion and a margin portion;
   the coating layer in the chisel edge portion and the margin portion has an alternating laminate structure of an alternating laminate of:
   a first composite nitride layer including a compound having a composition represented by formula (1) below:

$$(Al_{1-x}Cr_x)N \quad (1)$$

(in the formula, x denotes an atomic ratio of the Cr element based on the total of the Al element and the Cr element and satisfies $0.10 \leq x \leq 0.60$); and
   a second composite nitride layer including a compound having a composition represented by formula (2) below:

$$(Ti_{1-y}Si_y)N \quad (2)$$

(in the formula, y denotes an atomic ratio of the Si element based on the total of the Ti element and the Si element and satisfies $0.05 \leq y \leq 0.30$);
   an atomic ratio $C_{Cr}$ of the Cr element based on the total of the Al element and the Cr element in the first composite nitride layer in the chisel edge portion and an atomic ratio $M_{Cr}$ of the Cr element based on the total of the Al element and the Cr element in the first composite nitride layer in the margin portion satisfy a condition represented by formula (A) below:

$$C_{Cr} > M_{Cr} \quad (A).$$

2. The coated drill according to claim 1, wherein
   a difference between the $C_{Cr}$ and the $M_{Cr}$ satisfies a condition represented by formula (B) below:

$$0.01 \leq C_{Cr} - M_{Cr} \leq 0.10 \quad (B).$$

3. The coated drill according to claim 1, wherein
   an average thickness of each of the layers of the first composite nitride layer is 70 nm or more and 300 nm or less, and an average thickness of each of the layers of the second composite nitride layer is 70 nm or more and 300 nm or less.

4. The coated drill according to claim 1, wherein in the second composite nitride layer, a full width at half maximum for a (200) plane in X-ray diffraction is 0.4° or more and 1.0° or less.

5. The coated drill according to claim 1, wherein an average thickness of the alternating laminate structure is 1.5 µm or more and 12.0 µm or less.

6. The coated drill according to claim 1, wherein
   the coating layer has a lower layer between the substrate and the alternating laminate structure;
   the lower layer is comprised of a single layer or a laminate of a compound of: an element of at least one kind selected from the group consisting of Ti, Zr, Hf, V, Nb, Ta, Cr, Mo, W, Al, Si, and Y and an element of at least one kind selected from the group consisting of C, N, O, and B; and
   an average thickness of the lower layer is 0.1 µm or more and 3.5 µm or less.

7. The coated drill according to claim 1, wherein
   the coating layer has an upper layer on a surface of the alternating laminate structure;
   the upper layer is comprised of a single layer or a laminate of a compound of: an element of at least one kind selected from the group consisting of Ti, Zr, Hf, V, Nb, Ta, Cr, Mo, W, Al, Si, and Y and an element of at least one kind selected from the group consisting of C, N, O, and B; and an average thickness of the upper layer is 0.1 μm or more and 3.5 μm or less.

8. The coated drill according to claim 1, wherein an average thickness of the coating layer in its entirety is 1.5 μm or more and 15.0 μm or less.

9. The coated drill according to claim 1, wherein the substrate is any one of a cemented carbide, a cermet, a ceramic, and a cubic boron nitride sintered body.

10. The coated drill according to claim 2, wherein
an average thickness of each of the layers of the first composite nitride layer is 70 nm or more and 300 nm or less, and an average thickness of each of the layers of the second composite nitride layer is 70 nm or more and 300 nm or less.

11. The coated drill according to claim 2, wherein in the second composite nitride layer, a full width at half maximum for a (200) plane in X-ray diffraction is 0.4° or more and 1.0° or less.

12. The coated drill according to claim 3, wherein in the second composite nitride layer, a full width at half maximum for a (200) plane in X-ray diffraction is 0.4° or more and 1.0° or less.

13. The coated drill according to claim 10, wherein in the second composite nitride layer, a full width at half maximum for a (200) plane in X-ray diffraction is 0.4° or more and 1.0° or less.

14. The coated drill according to claim 2, wherein an average thickness of the alternating laminate structure is 1.5 μm or more and 12.0 μm or less.

15. The coated drill according to claim 3, wherein an average thickness of the alternating laminate structure is 1.5 μm or more and 12.0 μm or less.

16. The coated drill according to claim 4, wherein an average thickness of the alternating laminate structure is 1.5 μm or more and 12.0 μm or less.

17. The coated drill according to claim 10, wherein an average thickness of the alternating laminate structure is 1.5 μm or more and 12.0 μm or less.

18. The coated drill according to claim 11, wherein an average thickness of the alternating laminate structure is 1.5 μm or more and 12.0 μm or less.

19. The coated drill according to claim 12, wherein an average thickness of the alternating laminate structure is 1.5 μm or more and 12.0 μm or less.

20. The coated drill according to claim 13, wherein an average thickness of the alternating laminate structure is 1.5 μm or more and 12.0 μm or less.

* * * * *